United States Patent
Robin et al.

(10) Patent No.: US 10,497,743 B2
(45) Date of Patent: Dec. 3, 2019

(54) OPTOELECTRONIC DEVICE COMPRISING A LIGHT-EMITTING COMPONENT AND A TRANSISTOR

(71) Applicant: Commissariat à l'Énergie Atomique et aux Énergies Alternatives, Paris (FR)

(72) Inventors: Ivan-Christophe Robin, Grenoble (FR); Hubert Bono, Grenoble (FR); Thierry Bouchet, Corenc (FR); Matthew Charles, Grenoble (FR); René Escoffier, La Buisse (FR); Erwan Morvan, Montagne (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/781,085

(22) PCT Filed: Dec. 1, 2016

(86) PCT No.: PCT/FR2016/053173
§ 371 (c)(1),
(2) Date: Jun. 1, 2018

(87) PCT Pub. No.: WO2017/093678
PCT Pub. Date: Jun. 8, 2017

(65) Prior Publication Data
US 2018/0350870 A1    Dec. 6, 2018

(30) Foreign Application Priority Data
Dec. 3, 2015    (FR) ................ 15 61797

(51) Int. Cl.
H01L 27/15    (2006.01)
H01L 33/38    (2010.01)

(52) U.S. Cl.
CPC ............ *H01L 27/15* (2013.01); *H01L 33/382* (2013.01)

(58) Field of Classification Search
None
See application file for complete search history.

(56) References Cited

U.S. PATENT DOCUMENTS 5,021,361 A * 6/1991 Kinoshita ......... H01L 21/30612
148/DIG. 119

OTHER PUBLICATIONS

Lee et al., "Monolithic integration of GaN-based light-emitting diodes and metal-oxide-semiconductor field-effect transistors," Optics Express, vol. 22, Issue S6, pp. A1589-A1595. (Year: 2014).*

(Continued)

*Primary Examiner* — Bo B Jang
(74) *Attorney, Agent, or Firm* — Wolf, Greenfield & Sacks, P.C.

(57) ABSTRACT

An optoelectronic device including a light emitting component and a field-effect transistor, the optoelectronic device including a first semiconductor layer made of a III-V or II-VI compound doped a first conductivity type; an active layer of the light-emitting component; and a second semiconductor layer made of the III-V or III-VI compound doped a second conductivity type opposite the first type, the active layer being sandwiched between the first and second semiconductor layers, wherein the channel of the field-effect transistor is located in the first semiconductor layer, the first semiconductor layer being uninterrupted between the field-effect transistor and the lightemitting component.

15 Claims, 4 Drawing Sheets

(56) References Cited

OTHER PUBLICATIONS

Written Opinion for Application No. PCT/FR2016/053173 dated Mar. 9, 2017.
International Search Report for Application No. PCT/FR2016/053173 dated Mar. 9, 2017.
Lee et al., Monolithic integration of GaN-based light-emitting diodes and metal-oxide-semiconductor field-effect transistors. Optics Express. Oct. 20, 2014;22(S6):A1589-95.
Li et al., Monolithic integration of light-emitting diodes and power metal-oxide-semiconductor channel high-electron-mobility transistors for light-emitting power integrated circuits in GaN on sapphire substrate. Applied Physics Letters. 2013;102:192107-1-3.
Liu et al., Metal-interconnection-free integration of InGaN/GaN light emitting diodes with AlGaN/GaN high electron mobility transistors. Applied Physics Letters. 2015;106:181110-1-4.
Liu et al., Selective epitaxial growth of monolithically integrated GaN-based light emitting diodes with AlGaN/GaN driving transistors. Applied Physics Letters. 2014;104. 5 pages.

\* cited by examiner

OPTOELECTRONIC DEVICE COMPRISING A LIGHT-EMITTING COMPONENT AND A TRANSISTOR

This Application is a national stage filing under 35 U.S.C. 371 of International Patent Application Serial No. PCT/FR2016/053173, filed Dec. 1, 2016, entitled "OPTOELECTRONIC DEVICE COMPRISING A LIGHT-EMITTING COMPONENT AND A TRANSISTOR." Foreign priority benefits are claimed under 35 U.S.C. § 119(a)-(d) or 35 U.S.C. § 365(b) of French application number 1561797, filed Dec. 3, 2015. The entire contents of these applications are incorporated herein by reference in their entirety.

BACKGROUND

The present application relates to an optoelectronic device comprising a light-emitting component and a transistor for controlling the light-emitting component.

DISCUSSION OF THE RELATED ART

It is known to control a light-emitting component, particularly a light-emitting diode, with a transistor, particularly a metal-oxide field-effect transistor, also called MOS transistor, for example in the case where the light-emitting component is powered with an AC voltage.

It may be desirable for the light-emitting component and the MOS transistor to be made in integrated form, particularly when the MOS transistor should be a fast transistor, that is, which can switch at a frequency in the range from 300 kHz to 1 MHz.

FIG. 1 shows an electric diagram of an optoelectronic device 10 comprising a light-emitting diode LED series-assembled with a metal-oxide field effect transistor TMOS, for example, having an N channel. The anode of light-emitting diode LED is coupled to a node A. The cathode of light-emitting diode LED is coupled to the drain of transistor TMOS. The source of transistor TMOS is coupled to a node C. The gate of transistor TMOS is coupled to a node G.

FIG. 2 is a copy of FIG. 1 of the publication entitled "Monolithic integration of GaN-based light-emitting diodes and metal-oxide-semiconductor field-effect transistors" of Lee et al (Optics Express, Vol. 22, Issue S6, pp. A1589-A1595, 2014) and is a cross-section view of an embodiment of optoelectronic device 10 where light-emitting diode LED and the MOS transistor are formed in integrated fashion.

More particularly, optoelectronic device 10, shown in FIG. 2, substantially has a structure with a symmetry of revolution around an axis D and comprises, from bottom to top:

an insulating substrate 12 made of sapphire;
a non-intentionally doped GaN layer 14;
an N-type doped cylindrical central GaN portion 16;
an N-type doped ring-shaped GaN portion 18, separated from central portion 16 by a ring-shaped recess 20;
on central portion 16, an active layer 22 comprising multiple quantum wells;
on active layer 22, a P-type doped GaN layer 24;
an insulating layer 26 covering the entire structure;
a conductive pad 28, formed of a stack of a plurality of layers, in contact with P-type doped GaN layer 24 through insulating layer 26 and intended to be coupled to node A;
a ring-shaped connection track 30, formed of a stack of a plurality of layers, extending over insulating layer 26 and having its outer edge in contact with ring-shaped GaN portion 18 through insulating layer 26 and having its inner edge in contact with central portion 16 through insulating layer 26, where connection track 30 may be coupled to a conductive pad, not shown, enabling to apply an external voltage;
a ring-shaped conductive pad 32 extending over insulating layer 26 and forming the gate of transistor TMOS, pad 32 being intended to be coupled to node G; and
a ring-shaped pad 34, formed of a stack of a plurality of layers, in contact with ring-shaped GaN portion 18 through insulating layer 26 and intended to be coupled to node C.

Although the optoelectronic device shown in FIG. 2 operates properly, it has several disadvantages. A disadvantage is that it may be difficult to form an optoelectronic device 10 which is compact due to the presence of recess 20. Another disadvantage is that the upper surface of optoelectronic device 10, having pads 28, 32, and 34 formed thereon, is uneven. This may make it difficult to affix the optoelectronic device to another electronic circuit on the upper surface side.

Further, cylindrical central portion 16 and ring-shaped portion 18 are formed by the etching of recess 20 into N-type doped semiconductor GaN layer. The dopant concentration of this layer is generally high to obtain a proper operation of the light-emitting diode. The dopant concentration at the level of the channel of transistor TMOS is thus also high, which imposes a small thickness of ring-shaped portion 18 at the level of the channel of transistor TMOS. A disadvantage is that the forming of a thin channel may be difficult with the etch methods implemented to form ring-shaped GaN portion 18, since the etching should be stopped in N-type doped GaN layer. Indeed, no etch stop layer which would disturb the operation of the light-emitting diode can be provided.

SUMMARY

Thus, an object of an embodiment is to at least partly overcome the disadvantages of the previously-described optoelectronic devices and of their manufacturing methods.

Another object of an embodiment is to increase the compactness of the optoelectronic device.

Another object of an embodiment is for the upper surface of the optoelectronic device to be substantially planar.

Another object of an embodiment is for the optoelectronic device manufacturing method to be simple.

Thus, an embodiment provides an optoelectronic device comprising a light-emitting component and a field-effect transistor, the optoelectronic device comprising:

a first doped semiconductor layer of a III-V or II-VI compound, of a first conductivity type;
an active layer of the light-emitting component;
a second doped semiconductor layer of the III-V or II-VI compound, of a second conductivity type opposite to the first type, the active layer being sandwiched between the first and second semiconductor layers, wherein the channel of the field-effect transistor is located in the first semiconductor layer, the first semiconductor layer being uninterrupted between the field-effect transistor and the light-emitting component.

According to an embodiment, the optoelectronic device comprises a first trench successively crossing at least the second semiconductor layer, the active layer, and a portion only of the first semiconductor layer, and containing a first electrically-conductive core and a first electrically-insulating layer covering the walls of the first trench at least between the first electrically-conductive core and the second semiconductor layer and between the first electrically-conductive core and the active layer.

According to an embodiment, the first electrically-insulating layer covers the walls of the first trench between the first electrically-conductive core and the first semiconductor layer.

According to an embodiment, the first electrically-conductive core is in contact with the first semiconductor layer.

According to an embodiment, the work function of the material forming the first electrically-conductive core is greater than 4 eV.

According to an embodiment, the optoelectronic device further comprises a third doped semiconductor layer of the III-V or II-VI compound, of the first conductivity type, having a dopant concentration greater than the dopant concentration of the first semiconductor layer, in contact with the first semiconductor layer and interposed between the first semiconductor layer and the active layer.

According to an embodiment, the optoelectronic device comprises a second trench successively crossing at least the second semiconductor layer, the active layer, and all or part of the third semiconductor layer, and containing a second electrically-conductive core in contact with the third semiconductor layer and containing a second electrically-insulating layer covering the walls of the second trench at least between the second electrically-conductive core and the second semiconductor layer and between the second electrically-conductive core and the active layer.

According to an embodiment, the optoelectronic device comprises a first electrically-conductive pad in contact with the first electrically-conductive core and a second electrically-conductive pad in contact with the second electrically-conductive core, the first and second pads resting on a planar surface.

According to an embodiment, the active layer is the layer having most of the electromagnetic radiation supplied by the optoelectronic device emitted therefrom.

According to an embodiment, the active layer comprises a single quantum well or multiple quantum wells.

According to an embodiment, the dopant concentration of the first semiconductor layer is in the range from $10^{15}$ atoms/cm$^3$ to $10^{18}$ atoms/cm$^3$, preferably from $5.10^{16}$ atoms/cm$^3$ to $5.10^{17}$ atoms/cm$^3$.

According to an embodiment, the thickness of the second semiconductor layer opposite the first trench is in the range from 50 nm to 150 nm when the dopant concentration of the second semiconductor layer is greater than $10^{17}$ atoms/cm$^3$.

According to an embodiment, the thickness of the first electrically-conductive core is in the range from 10 times to 50 times the thickness of the first semiconductor layer opposite the first trench.

Another embodiment provides a method of manufacturing an optoelectronic device comprising a light-emitting component and a field-effect transistor, the method comprising the successive steps of:

forming a first doped semiconductor layer of a III-V or II-VI compound, of a first conductivity type;

forming an active layer of the light-emitting component;

forming a second doped semiconductor layer of the III-V or II-VI compound, of a second conductivity type opposite to the first type, the active layer being sandwiched between the first and second semiconductor layers; and forming the channel of the field-effect transistor in the first semiconductor layer, the first semiconductor layer being uninterrupted between the field-effect transistor and the light-emitting component.

According to an embodiment, the method further comprises the steps of:

forming a first trench successively crossing at least the second semiconductor layer, the active layer, and a portion only of the first semiconductor layer; and forming, in the first trench, a first electrically-conductive core and a first electrically-insulating layer covering the walls of the first trench at least between the first electrically-conductive core and the second semiconductor layer and between the first electrically-conductive core and the active layer.

According to an embodiment, the method further comprises the step of forming a third doped semiconductor layer of the III-V or II-VI compound, of the first conductivity type, having a dopant concentration greater than the dopant concentration of the first semiconductor layer, in contact with the first semiconductor layer and interposed between the first semiconductor layer and the active layer.

According to an embodiment, the method further comprises the steps of:

forming a second trench successively crossing at least the second semiconductor layer, the active layer, and a portion only of the third semiconductor layer; and forming, in the second trench, a second electrically-conductive core in contact with the third semiconductor layer and a second electrically-insulating layer covering the walls of the second trench at least between the second electrically-conductive core and the second semiconductor layer and between the second electrically-conductive core and the active layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
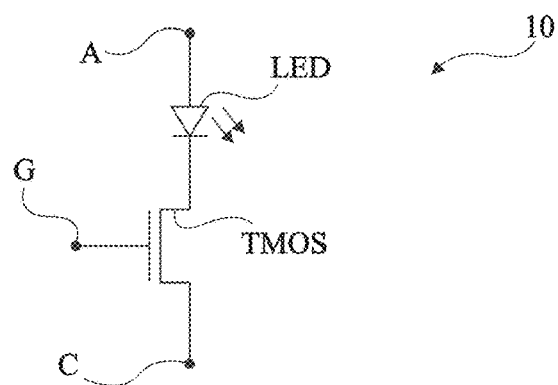
FIG. 1, previously described, shows an equivalent electric diagram of an optoelectronic device comprising a light-emitting diode and a MOS transistor.
Figure 2:
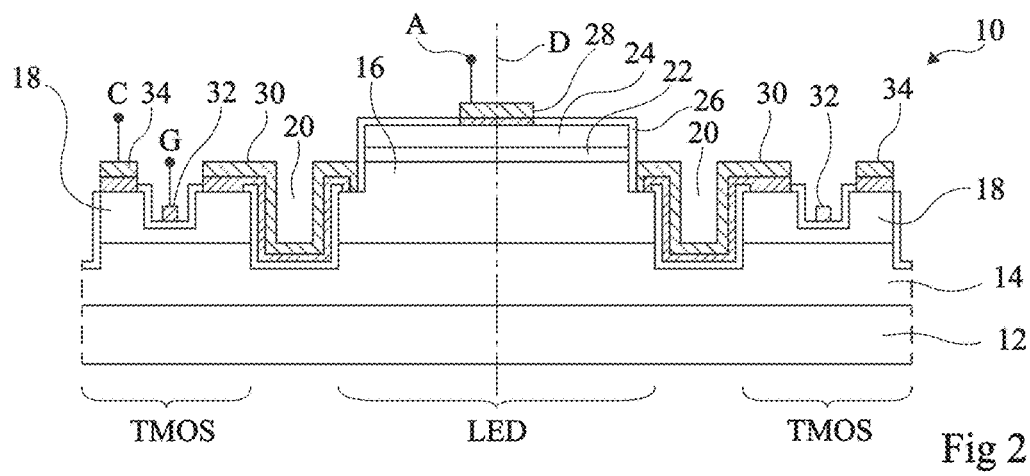
FIG. 2, previously described, is a cross-section view of an example of integrated embodiment of the optoelectronic device shown in FIG. 1.

For clarity, the same elements have been designated with the same reference numerals in the various drawings and, further, as usual in the representation of electronic circuits, the various drawings are not to scale. Further, only those elements which are useful to the understanding of the present description have been shown and will be described.

In particular, the means for powering the optoelectronic device described hereafter are within the abilities of those skilled in the art and are not described. The terms "approximately", "substantially", and "in the order of" are used herein to designate a tolerance of plus or minus 10%, preferably of plus or minus 5%, of the value in question.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use.

The present application relates to an optoelectronic device comprising a light-emitting component, for example, a light-emitting diode, comprising an active layer sandwiched between a first semiconductor layer and a second semiconductor layer. The first and second semiconductor layers are at least partly made up of at least one semiconductor material selected from the group comprising III-V compounds and II-VI compounds.

The semiconductor material may mainly comprise a III-V compound, for example, a III-N compound. Examples of group-III elements comprise gallium (Ga), indium (In), or aluminum (Al). Examples of group-V elements comprise nitrogen, phosphorus, or arsenic. Examples of III-V compounds are GaN, AlN, InN, InGaN, AlGaN, AlInGaN, $Al_xGa_yIn(1-x-y)$, $AsAP(1-a)$ or InP. Generally, the elements in the III-V compound may be combined with different molar fractions.

The semiconductor material may mainly comprise a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O), sulfur (S), selenium (Se), and tellurium (Te). Examples of II-VI compounds are ZnO, ZnMgO, CdZnO, CdZnMgO, CdHgTe, CdTe, HgTe, ZnSe, or ZnS. Generally, the elements in the II-VI compound may be combined with different molar fractions.

The semiconductor material may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), tin (Sn), or a group-VI dopant such as selenium (Se), sulfur (S), or terbium (Tb). Preferably, for GaN, the P-type dopant is magnesium and the N-type dopant is silicon.

The active layer is the layer from which most of the radiation delivered by the optoelectronic device is emitted. The active layer may comprise confinement means. As an example, the layer may comprise a single quantum well. It then comprises a semiconductor material different from the semiconductor material forming the first semiconductor layer and the second semiconductor layer and having a lower bandgap than the material forming the first semiconductor layer and the second semiconductor layer. As an example, when the semiconductor layers are mainly made of a III-V compound, the active layer may comprise an alloy of the III-V compound and of a third element, particularly InGaN or AlInGaN. The active layer may comprise multiple quantum wells. It then comprises a stack of semiconductor layers forming an alternation of quantum wells and of barrier layers.

Embodiments will be described in further detail in the case of an optoelectronic device having its first and second semiconductor layers mainly comprising GaN. It should however be clear that the semiconductor material forming the first and second semiconductor layers may correspond to any semiconductor material selected from the group comprising III-V compounds and II-VI compounds.

Figure 3:
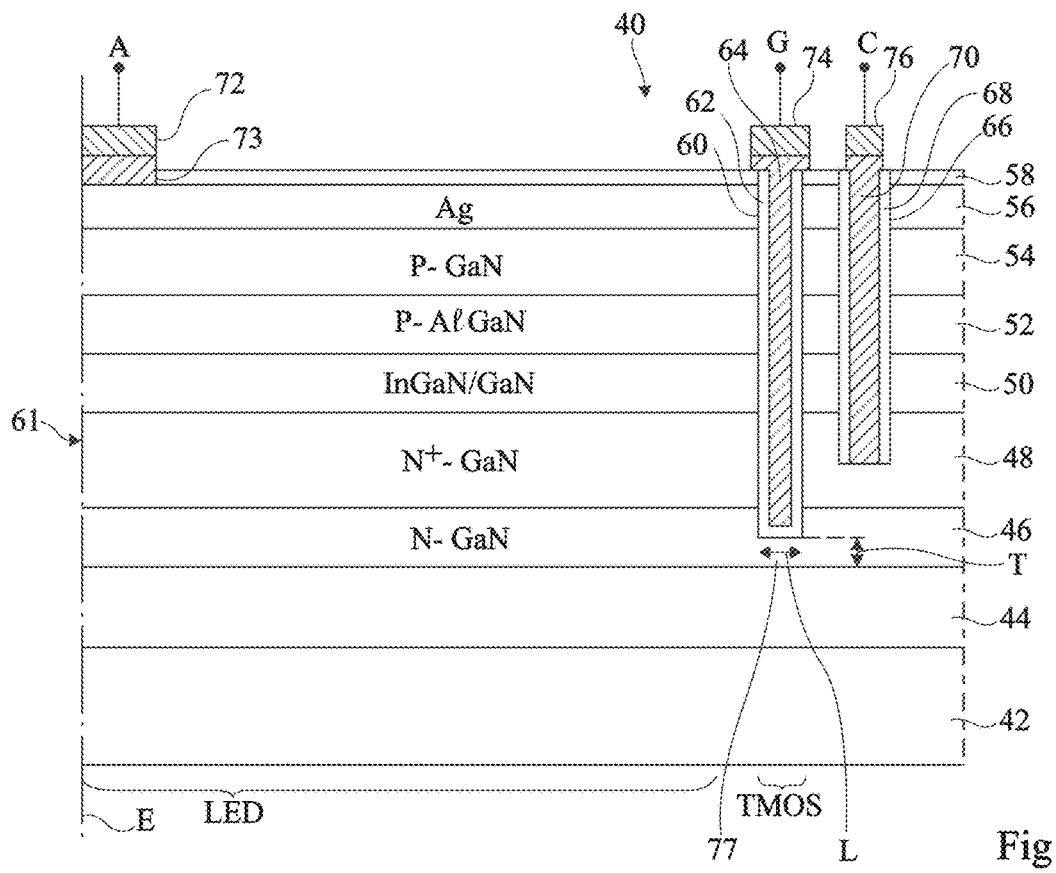
FIGS. 3 and 4 respectively are a partial and simplified cross-section view and top view of an integrated embodiment of the optoelectronic device shown in FIG. 1.
Figure 4:
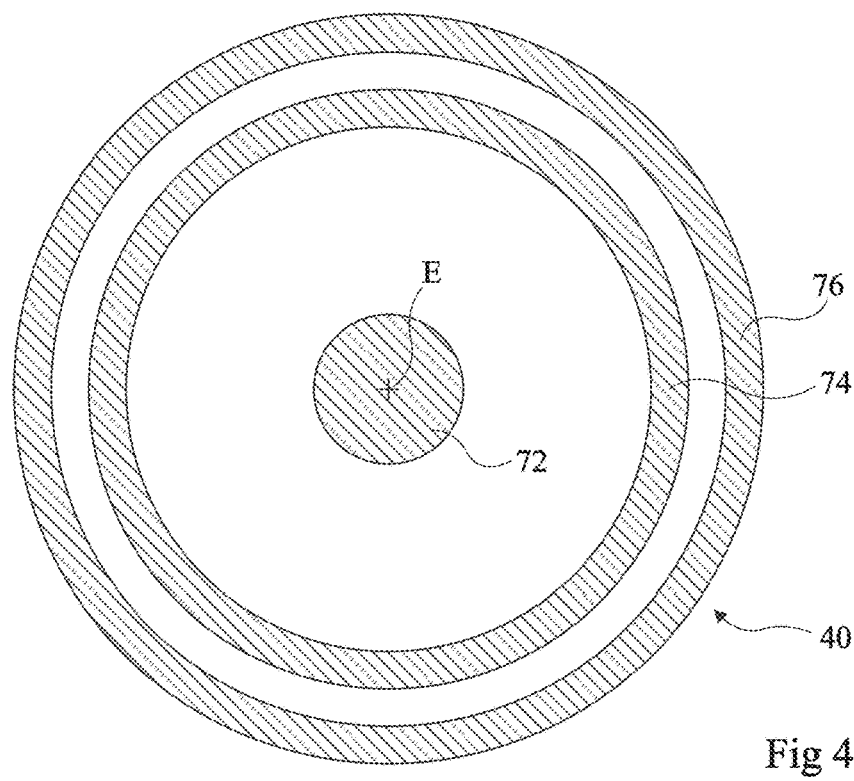

FIGS. 3 and 4 show an embodiment of an optoelectronic device 40 having as an equivalent electric diagram that shown in FIG. 1 and where the light-emitting diode LED and the MOS transistor are formed in integrated fashion.

More particularly, optoelectronic device 40 substantially has a structure with a symmetry of revolution around an axis E and comprises, from bottom to top in FIG. 3:

a substrate 42;

a transition layer 44, preferably insulating, which may correspond to a stack 44 of semiconductor layers;

a doped GaN layer 46 of a first conductivity type, for example, N-type doped, with a first dopant concentration;

a doped GaN layer 48 of the first conductivity type, for example, N-type doped, with a second dopant concentration greater than the first dopant concentration;

an active layer 50;

possibly, a barrier layer 52, for example, a doped AlGaN layer of a second conductivity type opposite to the first conductivity type, for example, P-type doped;

a doped GaN layer 54 of a second conductivity type opposite to the first conductivity type, for example, P-type doped;

an electrically-conductive layer 56, for example, metallic;

an electrically-insulating layer 58;

a first trench 60, for example, ring shaped, crossing the entire thickness of conductive layer 56, of P-type doped GaN layer 54, of barrier layer 52, of active layer 50, and of heavily N-type doped GaN layer 48 and only crossing a portion of the less heavily doped N-type GaN layer 46, the first trench 60 delimiting a central portion 61, for example, cylindrical, in layers 48, 50, 52, 54, and 56;

an electrically-insulating layer 62 covering the walls of trench 60;

a core 64 made of an electrically-conductive material filling first trench 60;

a second trench 66, for example, ring-shaped, crossing the entire thickness of conductive layer 56, of P-type doped GaN layer 54, of barrier layer 52, and of active layer 50 and crossing all or part of heavily N-type doped GaN layer 48, the second trench 66 being located around first trench 60;

an electrically-insulating layer 68 covering the lateral walls of trench 66 located opposite conductive layer 56, P-type doped GaN layer 54, barrier layer 52, and active layer 50, possibly covering the lateral walls of trench 66 located opposite heavily N-type doped GaN layer 48, and not covering the bottom of trench 66 located in heavily N-type doped GaN layer 48;

a core 70 made of an electrically-conductive material filling second trench 66 and in contact with heavily N-type doped GaN layer 48;

a first electrically-conductive pad 72, for example, cylindrical, possibly formed of a stack of a plurality of conductive layers, in contact with conductive layer 56 in an opening 73 crossing insulating layer 58 at the level of central portion 61 and intended to be coupled to node A;

a second electrically-conductive pad 74, for example ring-shaped, possibly formed of a stack of a plurality of conductive layers, in contact with conductive core 64 and intended to be coupled to node G; and a third electrically-conductive pad 76, for example ring-shaped, possibly formed of a stack of a plurality of conductive layers, in contact with conductive core 70 and intended to be coupled to node C.

The stack of layers 48, 50, 52, and 54 of central portion 61 forms light-emitting diode LED. Channel 77 of transistor TMOS forms in the portion of semiconductor layer 46 which extends between the bottom of trench 60 and layer 44. Conductive core 70 plays the role of a source contact of transistor TMOS. The biasing of light-emitting diode LED is performed by conductive pads 72 and 76.

Substrate 42 may correspond to a monoblock structure or correspond to a layer covering a support made of another material. Substrate 42 is preferably a semiconductor substrate, for example, a substrate made of silicon, of germanium, of silicon carbide, of silicon nitride, of a III-V compound, such as GaN or GaAs, or a ZnO or sapphire substrate. Preferably, substrate 42 is a single-crystal silicon substrate. Preferably, it is a semiconductor substrate compatible with manufacturing methods implemented in microelectronics. Substrate 42 may correspond to a multilayer structure of silicon-on-insulator type, also called SOI. As a variation, substrate 42 is an insulating substrate, for example, a sapphire substrate (Al2O3). Substrate 42 may have a thickness in the range from 300 μm to 2,000 μm.

Stack 44 of layers enables to favor the epitaxial growth of the subsequent layers on substrate 42. The thickness of stack 44 is in the range from 500 nm to 15 μm, for example, approximately 1 μm. In the case where substrate 42 is made of silicon and layers 46, 48, and 54 are made of GaN, stack 44 may comprise a barrier layer blocking gallium, for example, an aluminum nitride layer (AlN). Indeed, gallium may strongly react with silicon at the temperatures to which the semiconductor layers are taken during the optoelectronic device manufacturing method. Stack 44 may further comprise semiconductor layers which enable a lattice matching between semiconductor layers 46, 48 and substrate 42. As an example, in the case where substrate 42 is made of silicon and layers 46, 48, and 54 are made of GaN, stack 44 may comprise AlxGa1-xN layers, where x can vary from 0 to 1.

The thickness of lightly N-type doped GaN layer 46 is in the range from 50 nm to 3 μm. The N-type dopant concentration of layer 46 is in the range from $10^{15}$ atoms/cm$^3$ to $10^{18}$ atoms/cm$^3$, preferably from $5.10^{16}$ atoms/cm$^3$ to $5.10^{17}$ atoms/cm$^3$.

The minimum distance T between stack 44 and the bottom of first trench 60 is in the range from 50 nm to 150 nm and is preferably in the range from 50 nm to 100 nm when the N-type dopant concentration of layer 46 is greater than $10^{17}$ atoms/cm$^3$.

Length L of channel 77 of transistor TMOS, which substantially corresponds to the thickness of conductive core 64 measured along a direction perpendicular to the stacking direction of layers 46, 48, 50, 52, and 54, that is, to the difference between the outer diameter and the inner diameter of conductive core 64 in the case of a ring-shaped conductive core 54, is in the range from 10 times to 50 times, preferably from 10 times to 20 times, the channel thickness, for example, in the range from 1 μm to 5 μm.

The thickness of heavily N-type doped GaN layer 48 is in the range from 100 nm to 5 μm. The N-type dopant concentration of layer 48 is in the range from 1018 atoms/cm3 to 1020 atoms/cm3, for example, approximately 1019 atoms/cm3.

Conductive layer 56 enables to reflect the photons emitted by the light-emitting diode.

Insulating layer 58 may also be made of silicon oxide (SiO2). Insulating layer 62 may be made of hafnium oxide (HfO2), of aluminum oxide (Al2O3), or of silicon nitride (SiNx). The thickness of insulating layer 62 at the level of the channel of transistor TMOS may be in the range from 1 nm to 40 nm.

According to another embodiment, the gate of the MOS transistor may be replaced with a Schottky gate. A MESFET-type transistor (Metal Semiconductor Field Effect Transistor) is then obtained. In this case, insulating layer 62 is not present at the bottom of trench 60 and conductive core 64 is in contact with semiconductor layer 46 and forms a Schottky diode at this interface. Conductive core 64 is then, preferably, made of a metal having a work function greater than 4 eV, for example, nickel.

The MOS transistor or the MESFET transistor operates as follows. According to the voltage between the gate and the source of the transistor, the channel will be conductive or non-conductive. When the channel is conductive, electrons may flow from node C via the channel to the active area of the light-emitting diode to recombine with holes. When the channel is not conductive, electrons do not flow from node C to the active area of the light-emitting diode.

The fact for light-emitting diode LED to be directly contiguous to transistor TMOS advantageously enables to decrease the lateral bulk of optoelectronic device 40 with respect to optoelectronic device 10.

Figure 5:
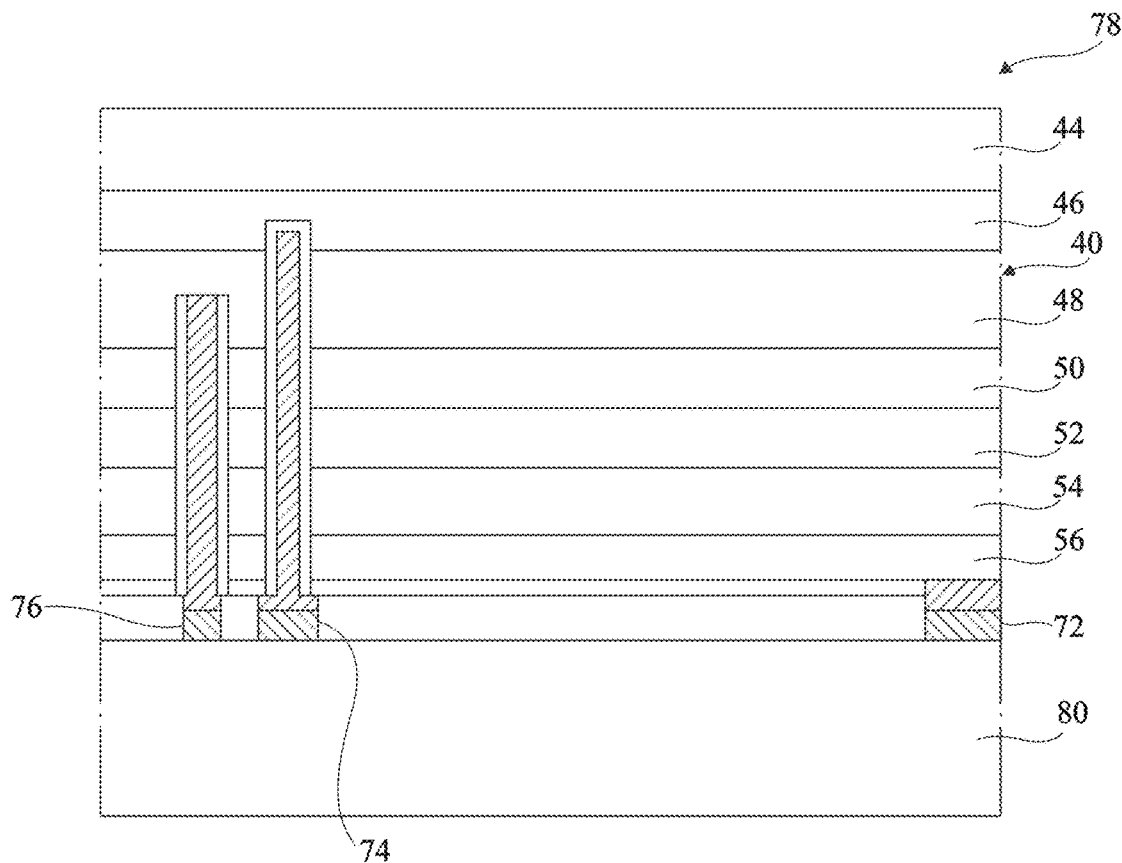
FIG. 5 is a partial simplified cross-section view of an optoelectronic system comprising the optoelectronic device shown in FIG. 3.

FIG. 5 shows an embodiment of an optoelectronic system 78 where optoelectronic device 40, such as shown in FIG. 3, is affixed to a support 80, for example, another electronic circuit on the side of conductive pads 72, 74, and 76. The surface of optoelectronic device 40 having conductive pads 72, 74, and 76 formed thereon being substantially planar, the affixing of optoelectronic device 40 to support 80 on the side of conductive pads 72, 74, and 76 is eased. According to an embodiment, as shown in FIG. 5, substrate 42 may be removed to ease the emission of the light emitted in the active area of light-emitting diode LED.

FIGS. 6 to 9 show curves, respectively C1, C2, C3, and C4, of the variation of the current density flowing through light-emitting diode LED of the optoelectronic device 40 shown in FIG. 3 according to voltage VAC between nodes A and C for different voltages applied to the gate of transistor TMOS. The voltage at the gate is referenced to node C. Curves C1, C2, C3, and C4 have been obtained by simulation with the following parameters:

silicon substrate 42 with a 1-μm thickness;

AlN layer 44 with a 1-μm thickness;

N-type doped GaN layer 46 with a 200-nm thickness and a dopant concentration of 1017 atoms/cm3;

N-type doped GaN layer with a 2-μm thickness and a dopant concentration of 1019 atoms/cm3;

active layer 50 comprising multiple quantum wells with a total 100-nm thickness;

P-type doped AlGaN layer 52 with a 100-nm thickness and a dopant concentration of 1019 atoms/cm3;

P-type doped GaN layer 54 with a dopant concentration of 1019 atoms/cm3;

length L of channel 77 of the TMOS transistor of 5 μm;

distance T of 100 nm; and thickness of insulating layer 62 at the level of channel 77 of the TMOS transistor of 10 nm.

Figure 6:
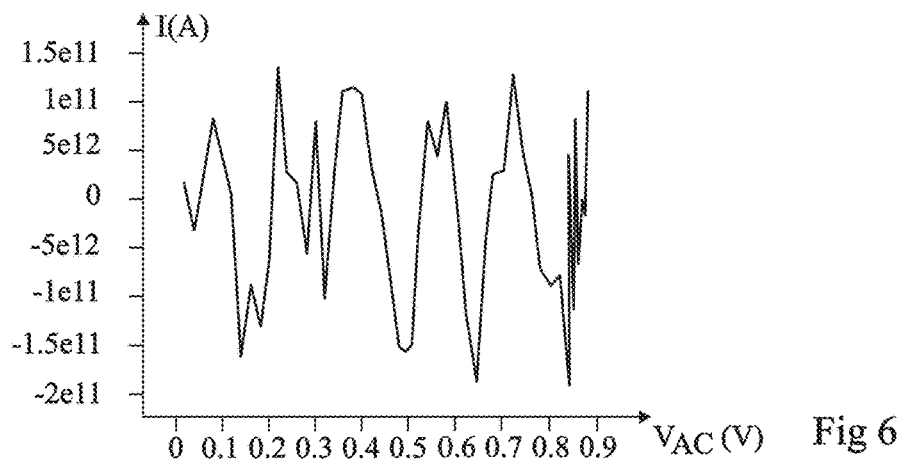
FIGS. 6 to 9 show curves of the variation of the current flowing through the light-emitting diode of the opto-electronic device shown in FIG. 3 according to the voltage between nodes A and C of the optoelectronic device for different voltages applied to the gate of the MOS transistor of the optoelectronic device.

Curve C1, shown in FIG. 6, has been obtained with a gate voltage of −2 V. Substantially no current flows through light-emitting diode LED. The TMOS transistor then plays the role of an off switch.

Figure 7:
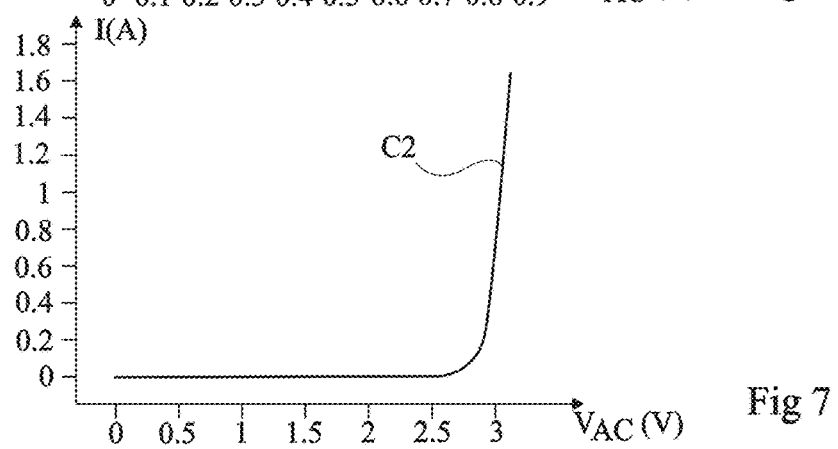

Curve C2, shown in FIG. 7, has been obtained with a gate voltage of 0 V. The current density flowing through light-emitting diode LED was 1.8 A/cm2 for a voltage VAC equal to 3 V.

Figure 8:
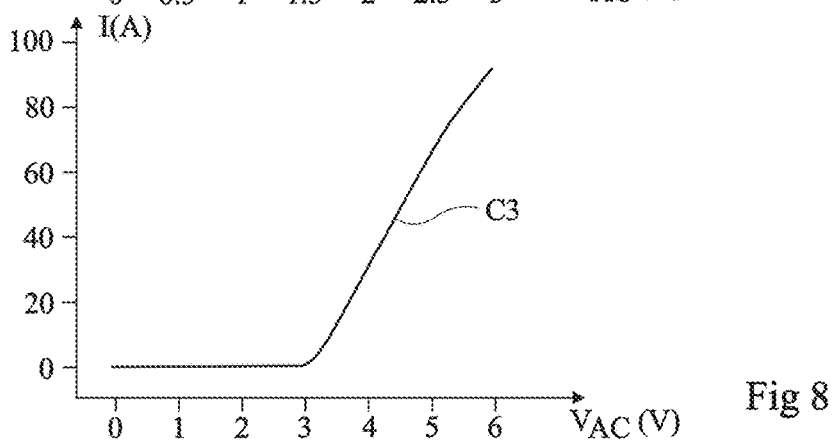

Curve C3, shown in FIG. 8, has been obtained with a 2-V gate voltage. The current density flowing through light-emitting diode LED was 100 A/cm2 for a voltage VAC equal to 6 V.

Figure 9:
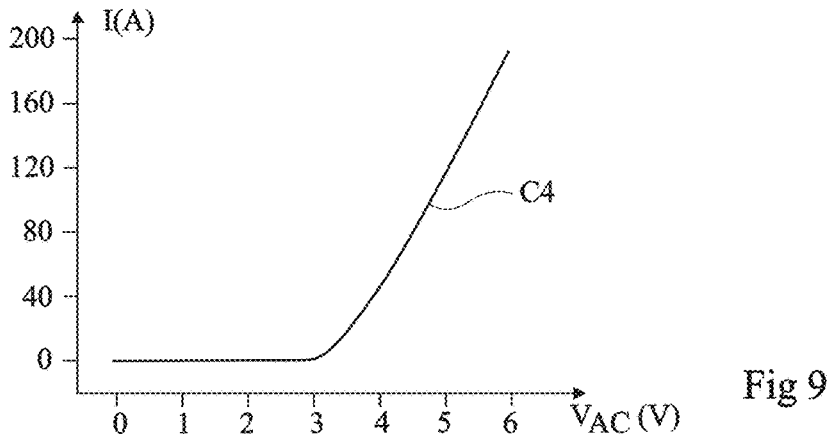

Curve C4, shown in FIG. 9, has been obtained with an 8-V gate voltage. The current density flowing through light-emitting diode LED was 200 A/cm2 for a voltage VAC equal to 6 V. The conductivity of transistor TMOS increases when the gate voltage increases.

FIGS. 10A to 10F are partial simplified cross-section views of the structures obtained at successive steps of another embodiment of a method of manufacturing the optoelectronic device of FIG. 40 shown in FIG. 3.

Figure 10A:
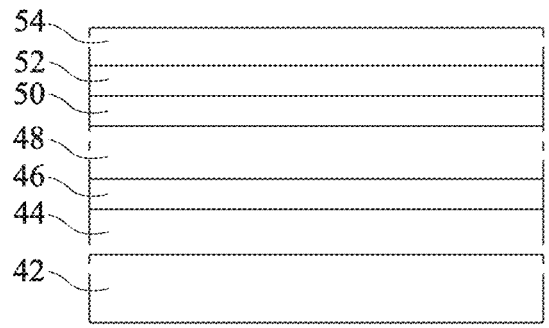
FIGS. 10A to 10F are partial simplified cross-section views of the structures obtained at successive steps of another embodiment of a method of manufacturing the optoelectronic device of FIG. 3.

FIG. 10A shows the structure obtained after having grown semiconductor layers 44, 46, 48, 50, 52, and 54 on substrate 42. The method of growing these layers may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used.

Figure 10B:
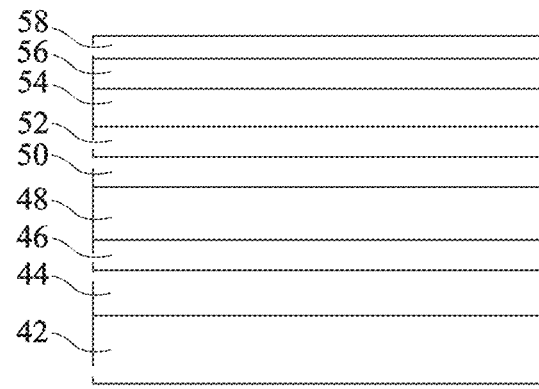

FIG. 10B shows the structure obtained after having deposited conductive layer 56 on layer 54 and after having formed insulating layer 58 on conductive layer 56. Conductive layer 56 may be deposited by physical vapor deposition (PVD). Insulating layer 58 may be deposited by CVD or PVD.

Figure 10C:
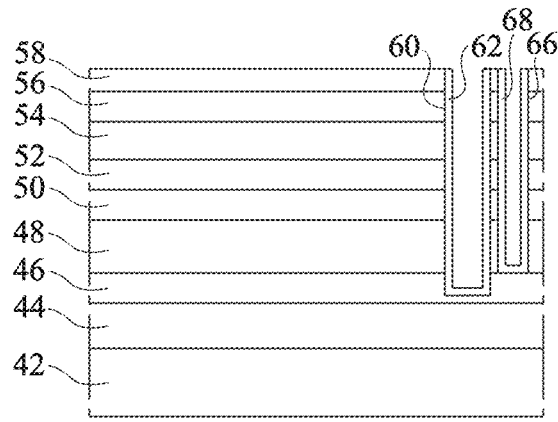

FIG. 10C shows the structure obtained after having formed the first and second trenches 60, 66 and after having deposited insulating layer 62 on all the walls of first trench 60 and insulating layer 68 on all the walls of second trench 66. First and second trenches 60, 66 may be formed by anisotropic etching, for example deep reactive ion etching. Insulating layers 62, 68 may be deposited by atomic layer deposition (ALD).

The dopant concentration of layer 46 which is decreased with respect to layer 48 provides a thickness T of the TMOS transistor greater than that which would be provided if the dopant concentration of layer 46 was greater. This enables to implement an etch method for the forming of first trench 60 where the etch stop can be obtained with an accuracy of +/−10 nm.

Figure 10D:
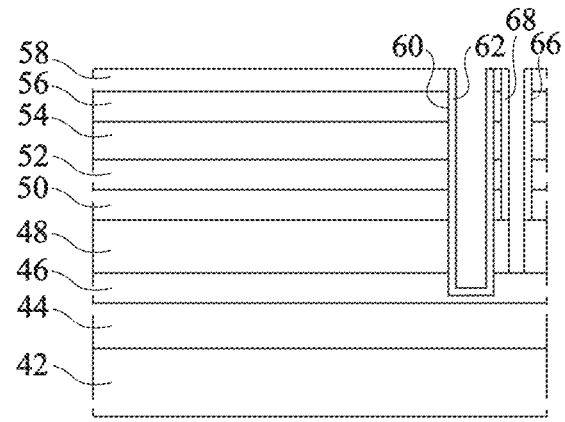

FIG. 10D shows the structure obtained after having etched insulating layer 68 at the bottom of trench 66. The etching of insulating layer 68 may be performed by an ion beam etching in trench 66. In the present embodiment, second trench 66 extends across the entire thickness of heavily N-type doped GaN layer 48 and insulating layer 68 is removed for the portion of trench 66 extending in layer 48.

Figure 10E:
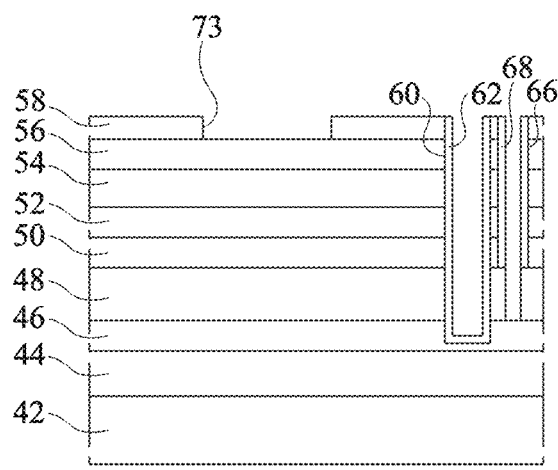

FIG. 10E shows the structure obtained after having formed opening 73 in insulating layer 58, for example, by anisotropic etching.

Figure 10F:
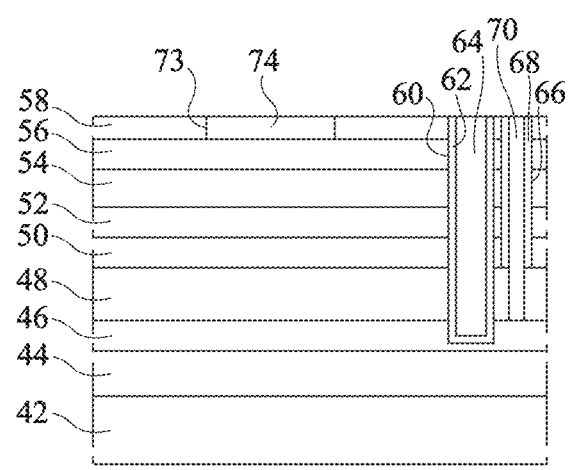

FIG. 10F shows the structure obtained after having deposited a metal layer over the entire structure shown in FIG. 10E, and particularly in opening 73, in first trench 60, and in second trench 66 and after having removed the portions of the metal layer outside of opening 73, of first trench 60, and of second trench 66, for example, by a step of chemical etching with an etch stop on insulating layer 58. In the present embodiment, the same metal is used to form conductive cores 64, 70 and conductive pad 74. As a variation, different materials may be used to form conductive cores 64, 70 and conductive pad 74.

Specific embodiments have been described. Various alterations and modifications will occur to those skilled in the art. In particular, although embodiments of optoelectronic devices have been described where the optoelectronic device comprises at least one light-emitting diode, it should be clear that the light-emitting component may be a component different from a light-emitting diode. As an example, the light-emitting component may comprise a laser diode, for example, a vertical external cavity surface-emitting laser, also called VCSEL. Further, although in the previously described embodiments, the MOS transistor has an N channel, it should be clear that the optoelectronic device may comprise a P-channel MOS transistor obtained by inverting the conductivity types of the semiconductor layers. Further, although in the previously-described embodiments, conductive cores 64 and 70 have the shape of a ring with a circular base, conductive cores 64, 70 may have a different shape, for example, a planar shape or the shape of a ring with a square base.

The invention claimed is:

1. An optoelectronic device comprising a light-emitting component and a field-effect transistor, the optoelectronic device comprising:
    a first doped semiconductor layer of a III-V or II-VI compound, of a first conductivity type;
    an active layer of the light-emitting component;
    a second doped semiconductor layer of the III-V or II-VI compound, of a second conductivity type opposite to the first conductivity type, the active layer being sandwiched between the first and second doped semiconductor layers,
    wherein a channel of the field-effect transistor is located in the first doped semiconductor layer, the first doped semiconductor layer being uninterrupted between the field-effect transistor and the light-emitting component, and
    the optoelectronic device further comprising a first trench successively crossing at least the second doped semiconductor layer, the active layer, and a portion only of the first doped semiconductor layer, and containing a first electrically-conductive core and a first electrically-insulating layer covering walls of the first trench at least directly between the first electrically-conductive core and the second doped semiconductor layer and directly between the first electrically-conductive core and the active layer.

2. The optoelectronic device of claim 1, wherein the first electrically-insulating layer covers walls of the first trench between the first electrically-conductive core and the first doped semiconductor layer.

3. The optoelectronic device of claim 1, wherein the first electrically-conductive core is in contact with the first doped semiconductor layer.

4. The optoelectronic device of claim 3, wherein a work function of a material forming the first electrically-conductive core is greater than 4 eV.

5. The optoelectronic device of claim 1, further comprising a third doped semiconductor layer of the III-V or II-VI compound, of the first conductivity type, having a dopant concentration greater than a dopant concentration of the first doped semiconductor layer, in contact with the first doped semiconductor layer and interposed between the first doped semiconductor layer and the active layer.

6. The optoelectronic device of claim 5, comprising a second trench successively crossing at least the second doped semiconductor layer, the active layer, and all or part of the third doped semiconductor layer, and containing a second electrically-conductive core in contact with the third doped semiconductor layer and containing a second electrically-insulating layer covering walls of the second trench at least between the second electrically-conductive core and the second doped semiconductor layer and between the second electrically-conductive core and the active layer.

7. The optoelectronic device of claim 6, comprising a first electrically-conductive pad in contact with the first electrically-conductive core and a second electrically-conductive pad in contact with the second electrically-conductive core, the first and second electrically-conductive pads resting on a planar surface.

8. The optoelectronic device of claim 1, wherein the active layer is a layer having most of an electromagnetic radiation supplied by the optoelectronic device emitted therefrom.

9. The optoelectronic device of claim 8, wherein the active layer comprises a single quantum well or multiple quantum wells.

10. The optoelectronic device of claim 1, wherein a dopant concentration of the first doped semiconductor layer is in the range from $10^{15}$ atoms/cm$^3$ to $10^{18}$ atoms/cm$^3$.

11. The optoelectronic device of claim 1, wherein a thickness of the second doped semiconductor layer opposite the first trench is in the range from 50 nm to 150 nm when a dopant concentration of the second doped semiconductor layer is greater than $10^{17}$ atoms/cm$^3$.

12. The optoelectronic device of claim 1, wherein a thickness of the first electrically-conductive core is in the range from 10 times to 50 times a thickness of the first doped semiconductor layer opposite the first trench.

13. A method of manufacturing an optoelectronic device comprising a light-emitting component and a field-effect transistor, the method comprising the successive steps of:
   forming a first doped semiconductor layer of a III-V or II-VI compound, of a first conductivity type;
   forming an active layer of the light-emitting component;
   forming a second doped semiconductor layer of the III-V or II-VI compound, of a second conductivity type opposite to the first conductivity type, the active layer being sandwiched between the first and second doped semiconductor layers;
   forming a channel of the field-effect transistor in the first doped semiconductor layer, the first doped semiconductor layer being uninterrupted between the field-effect transistor and the light-emitting component;
   forming a first trench successively crossing at least the second doped semiconductor layer, the active layer, and a portion only of the first doped semiconductor layer; and
   forming, in the first trench, a first electrically-conductive core and a first electrically-insulating layer covering walls of the first trench at least directly between the first electrically-conductive core and the second doped semiconductor layer and directly between the first electrically-conductive core and the active layer.

14. The method of claim 13, further comprising the step of forming a third doped semiconductor layer of the III-V or II-VI compound, of the first conductivity type, having a dopant concentration greater than a dopant concentration of the first doped semiconductor layer, in contact with the first doped semiconductor layer and interposed between the first doped semiconductor layer and the active layer.

15. The method of claim 14, further comprising the steps of:
   forming a second trench successively crossing at least the second doped semiconductor layer, the active layer, and a portion only of the third doped semiconductor layer; and
   forming, in the second trench, a second electrically-conductive core in contact with the third doped semiconductor layer and a second electrically-insulating layer covering walls of the second trench at least between the second electrically-conductive core and the second doped semiconductor layer and between the second electrically-conductive core and the active layer.

* * * * *